(12) United States Patent
Kim et al.

(10) Patent No.: US 11,343,453 B2
(45) Date of Patent: May 24, 2022

(54) TDI IMAGE SENSOR CAPABLE OF EXPOSURE CONTROL AND CONTROL SYSTEM INCLUDING THE SAME

(71) Applicant: VIEWORKS CO., LTD., Anyang (KR)

(72) Inventors: Young Ho Kim, Seoul (KR); Young Young Sim, Shiheung (KR)

(73) Assignee: VIEWORKS CO., LTD., Anyang-si (KR)

( * ) Notice: Subject to any disclaimer, the term of this patent is extended or adjusted under 35 U.S.C. 154(b) by 100 days.

(21) Appl. No.: 16/932,712

(22) Filed: Jul. 18, 2020

(65) Prior Publication Data

US 2021/0021780 A1 Jan. 21, 2021

(30) Foreign Application Priority Data

Jul. 20, 2019 (KR) .......................... 10-2019-0087983

(51) Int. Cl.
*H04N 5/372* (2011.01)
*H01L 27/148* (2006.01)
*H01L 27/146* (2006.01)

(52) U.S. Cl.
CPC ... *H04N 5/37206* (2013.01); *H01L 27/14609* (2013.01); *H01L 27/14627* (2013.01); *H01L 27/14818* (2013.01)

(58) Field of Classification Search
CPC .. H04N 5/37206; H04N 5/353; H04N 5/2353; H04N 5/355; H04N 5/3765; H01L 27/14609; H01L 27/14627; H01L 27/14818; H01L 27/14856
See application file for complete search history.

(56) References Cited

U.S. PATENT DOCUMENTS

| 2011/0317052 A1* | 12/2011 | Kieft | G01N 21/6428 |
| | | | 348/E5.091 |
| 2014/0184847 A1* | 7/2014 | Fujita | H04N 5/2354 |
| | | | 348/222.1 |
| 2017/0142362 A1 | 5/2017 | Liu | |
| 2021/0168320 A1* | 6/2021 | Barbier | H01L 27/14856 |

FOREIGN PATENT DOCUMENTS

| CN | 103718210 A | 4/2014 |
| JP | 2019-75682 | 5/2019 |
| KR | 10-2014-0051971 A | 5/2014 |

* cited by examiner

*Primary Examiner* — Nhan T Tran
(74) *Attorney, Agent, or Firm* — Rabin & Berdo, P.C.

(57) ABSTRACT

Disclosed is a time delayed integration (TDI) image sensor capable of exposure control, including a pixel area including a plurality of line sensors, a light mask configured to block the incidence of light on part of the line sensors, and a scan controller configured to generate a line control signal and an exposure control signal based on the line trigger signal and to control movement of charges in the plurality of line sensors based on the generated line control signal and exposure control signal.

19 Claims, 14 Drawing Sheets

TDI IMAGE SENSOR CAPABLE OF EXPOSURE CONTROL AND CONTROL SYSTEM INCLUDING THE SAME

CROSS-REFERENCE TO RELATED APPLICATION

This application claims priority from and the benefit of Korean Patent Application No. 10-2019-0087983, filed on Jul. 20, 2019, which is hereby incorporated by reference for all purposes as if fully set forth herein.

BACKGROUND

Field

The present disclosure relates to a time delayed integration (TDI) image sensor, and particularly, to a TDI image sensor capable of exposure control and a control system including the same.

Related Art

As production equipment becomes massified, automated and refined, functions performed by the naked eyes of a person or various types of sensors are substituted with image sensors. An example of the semiconductor devices mainly used in image sensors includes a charge coupled device (hereinafter, referred to as a "CCD").

The CCD is a device capable of transmitting charges from one element to another element next to the element. An image sensor using CCDs has a structure for converting the amount of charges generated by light into electrical signals. Generally, an image sensor using CCDs includes a cell region in which charges are accumulated and an output circuit including shift registers for sequentially transmitting the accumulated charges.

Examples of scan methods that can be employed by an image sensor include an area scan method, a line scan method, and a time delayed integration (TDI) line scan method.

In an image sensor using the TDI line scan method, a plurality of line sensors are arranged in the scan direction (e.g., the column direction of the pixel matrix). CCDs in each line transmit integrated charges to the CCDs in the next line in synchronization with movement of the scan object (i.e., the target object to scan). After charges are accumulated by repeating this process up to the last line sensor, an image can be obtained by outputting and processing the accumulated charges.

If an image scan is actually performed, an apparatus for conveying the scan object (e.g., a conveyor belt) could move slowly or fast, thereby failing to move the scan object at a constant speed. In this case, the non-uniformity of image levels may occur because the exposure times in the respective line sensors are not constant. For example, when the conveyor belt for conveying the scan object is driven, if the speed of the driving motor is initially low and then becomes high, there is a problem in that a uniform image of the scan object is not formed because the exposure time in each line sensor is initially long and then becomes short.

SUMMARY

Various embodiments are directed to the provision of a TDI image sensor capable of exposure control and a control system including the same, wherein each of a plurality of lines can accumulate incident light for the same length of time.

The objects of the present disclosure are not limited to the aforementioned objects, and other objects and advantages of the present disclosure not described above may be understood from the following description and evidently understood based on embodiments of the present disclosure. It may be easily seen that the objects and advantages of the present disclosure may be realized by means written in the claims and a combination thereof.

In one embodiment, a time delayed integration (TDI) image sensor capable of exposure control and a control system including the same may include a pixel area including a plurality of line sensors, a light mask configured to block the incidence of light on some of the plurality of line sensors, and a scan controller configured to generate a line control signal and an exposure control signal based on an external line trigger signal and to control movement of charges in the plurality of line sensors based on the generated line control signal and exposure control signal.

In one embodiment, a time delayed integration (TDI) image sensor capable of exposure control and a control system including the same may include a pixel area having odd-numbered line sensors and even-numbered line sensors alternately disposed therein, and a scan controller configured to control movement of charges in the odd-numbered line sensors and the even-numbered line sensors, so that the exposure time of light for the even-numbered lines sensor is constant.

In one embodiment, a time delayed integration (TDI) image sensor capable of exposure control and a control system including the same may include a pixel area in which odd-numbered line sensors exposed to light and even-numbered line sensors blocked from light are alternately disposed, and a scan controller configured to control movement of charges in the even-numbered line sensors and the odd-numbered line sensors, so that the exposure time of light for the odd-numbered line sensors is constant.

In one embodiment, a time delayed integration (TDI) image sensor capable of exposure control and a control system including the same may include a pixel area including a plurality of line sensors, a light mask configured to block the incidence of light on a part of each of the line sensors, a microlens positioned in front of the remaining part except the part of each line sensor, and a scan controller configured to generate an exposure control signal based on an external line trigger signal and to control movement of charges in the plurality of line sensors based on the line trigger signal and the exposure control signal.

In one embodiment, a time delayed integration (TDI) image sensor capable of exposure control and a control system including the same may include a pixel area including a plurality of line sensors, wherein the incidence of light on a part of each of the line sensors is blocked by a light mask and the remaining part of each line sensor is exposed to light, and a scan controller configured to control movement of charges in the part of the line sensor on which the incidence of light is blocked and the part of the line sensor which is exposed to the light, so that the exposure time of light for the exposed part of the line sensor is constant.

In one embodiment, a method of controlling a time delayed integration (TDI) image sensor capable of exposure control may include a setting step of setting an exposure time in a register of a scan controller with respect to the TDI image sensor in which a light mask is positioned in a plurality of line sensors, and a control step of controlling light to be incident on line sensors on which the incidence of light is not blocked by the light mask, for only the exposure time.

DETAILED DESCRIPTION

Figure 1:
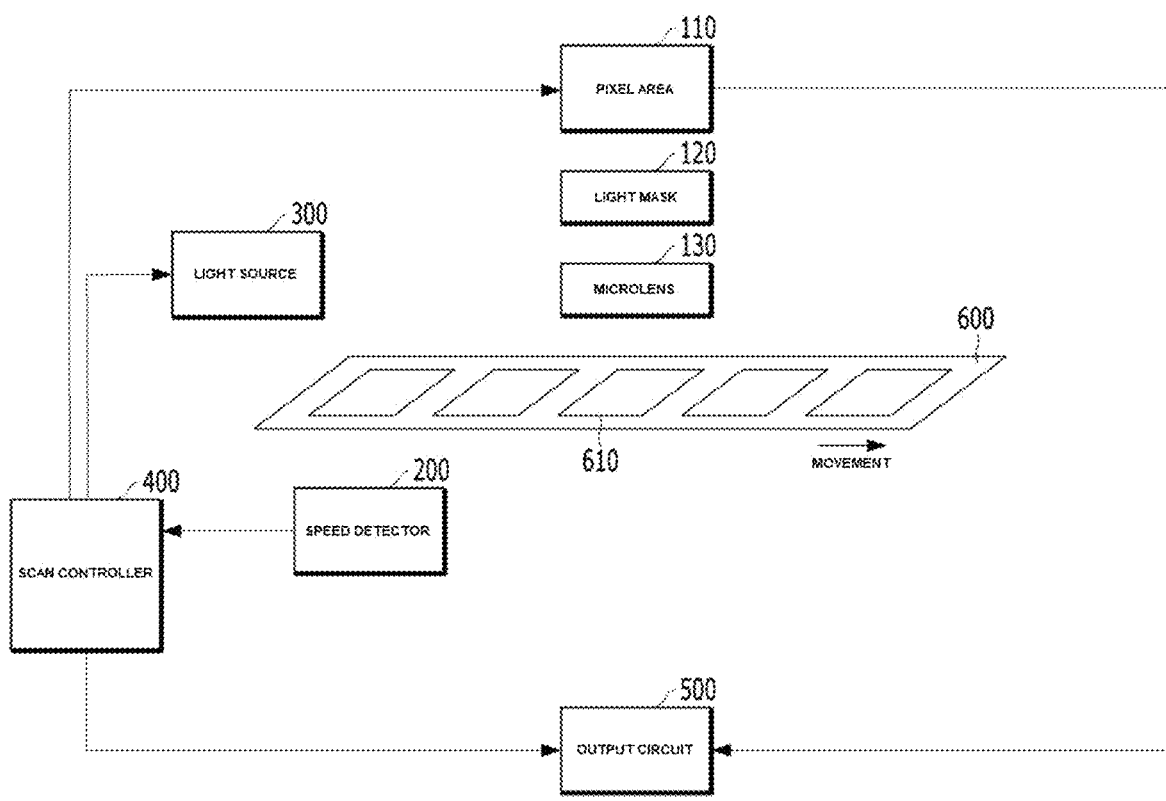
FIG. 1 shows a schematic configuration of a time delayed integration (TDI) image sensor capable of exposure control and a control system including the same according to one embodiment of the present disclosure.

Hereinafter, various examples of embodiments will be described in detail with reference to the accompanying drawings.

The aforementioned objects, characteristics, and merits are described later in detail with reference to the accompanying drawings, and thus a person having ordinary skill in the art to which the present disclosure pertains may readily carry out the technical spirit of the present disclosure. Furthermore, in describing the present disclosure, a detailed description of publicly-known art related to the present disclosure will be omitted if it is deemed to make the subject matter of the present disclosure unnecessarily vague. Hereinafter, embodiments according to the present disclosure are described in detail with reference to the accompanying drawings. In the drawings, the same reference numerals are used to indicate the same or similar elements.

FIG. 1 shows a schematic configuration of a time delayed integration (TDI) image sensor capable of exposure control and a control system including the same according to one embodiment of the present disclosure.

Referring to FIG. 1, a TDI image sensor capable of exposure control and the control system including the same according to one embodiment of the present disclosure may include a pixel area 110, a light mask 120, a microlens 130, a speed detector 200, a light source 300, a scan controller 400 and an output circuit 500. In this case, the TDI image sensor may include the pixel area 110, the light mask 120 and the microlens 130. Furthermore, an image sensor control system including the TDI image sensor may include the pixel area 110, the light mask 120, the microlens 130, the scan controller 400 and the output circuit 500.

The pixel area 110 is an element for sensing an image, and may be configured with imaging devices, such as charged coupled devices (CCDs). The pixel area 110 may be configured with a plurality of line sensors configured as a plurality of image devices. Each line sensor may be extended in a direction orthogonal to the moving direction of a scan object 610, that is, a direction (i.e., the row direction of the pixel matrix) perpendicular to the scan direction (i.e., the column direction of the pixel matrix).

The pixel area 110 may be configured to enable the amount of charges, corresponding to the amount of light that penetrates or is reflected by the scan object 610, to be accumulated while the charges move in the column direction of the pixel matrix according to a time delayed integration (TDI) method.

The light mask 120 may be positioned in front of a part of each line sensor configured in the pixel area 110 so that light coming from the scan object 610 is not incident on the part of the line sensor. For example, the light mask 120 may be positioned in front of half of each line sensor so that light is not incident on the half of the line sensor. In this application, one embodiment in which half of each line sensor is optically masked is mainly described, for convenience of a description, but embodiments in which ⅓, ¼, etc. of each line sensor is optically masked are also adoptable, if necessary.

The light mask 120 may be implemented as a metallic light-masking layer (illustrated in FIGS. 3A to 3D). For example, the metallic light-masking layer of the light mask 120 may be positioned in front of each of the line sensors so that light is alternately incident on parts of the line sensors. For example, the metallic light-masking layer of the light mask 120 may be positioned in front of each line sensor, and may block light from being incident on half of the line sensor.

The microlens 130 may be configured to enhance light incoming from the scan object 610 and to transmit the light to the pixel area 110. The microlens 130 may be positioned in front of the light mask 120.

The speed detector 200 may be configured to detect the moving speed of a conveyor 600 that conveys the scan object 610. For example, the speed detector 200 may detect the moving speed of the conveyor 600 and provide the detected moving speed to the scan controller 400. That is, the speed detector 200 may detect the moving speed of the conveyor 600 by measuring the interval between line trigger signals L_p generated each time the scan object 610 moves a given distance (e.g., 50 µm) in the conveyor 600. The conveyor 600 used in one embodiment of the present disclosure may be any suitable apparatus for moving the scan object 610 in order for the scan object to be scanned by the image sensor and may be a conveyor belt, for example, but is not limited thereto.

The light source 300 may be configured to emit light incident on the pixel area 110.

The scan controller 400 may generate an exposure control signal E_p based on the external line trigger signal L_p that is input in synchronization with movement of the scan object 610, and may control movement of charges in the pixel area 110 based on the line trigger signal L_p and the exposure control signal E_p.

For example, when the moving speed of the conveyor 600 is decreased, the period in which the line trigger signal L_p input to the scan controller 400 is generated may be increased. That is, the scan controller 400 may detect that the time interval between the line trigger signals L_p is increased when the moving speed of the conveyor 600 is decreased. When the moving speed of the conveyor 600 is increased, the period in which the line trigger signal L_p input to the scan controller 400 is generated may be decreased. That is, the scan controller 400 may detect that the time interval between the line trigger signals L_p is decreased when the moving speed of the conveyor 600 is increased. Accordingly, the scan controller 400 may continuously monitor the period in which the line trigger signals L_p input to the scan controller 400 are generated, based on the moving speed of the conveyor 600.

When a preset time elapses after the line trigger signal L_p is input (alternatively, at the same time the line trigger signal L_p is input), the scan controller 400 may internally and automatically generate the exposure control signal E_p. As a result, the scan controller 400 can constantly maintain the interval between the line trigger signal L_p and the exposure control signal E_p.

The output circuit 500 may process and output the results of sensing, provided by the pixel area 110, under the control of the scan controller 400 and constitute an inspection system for detecting defects, etc. in the scan object 610 using the results of sensing.

Figure 2:
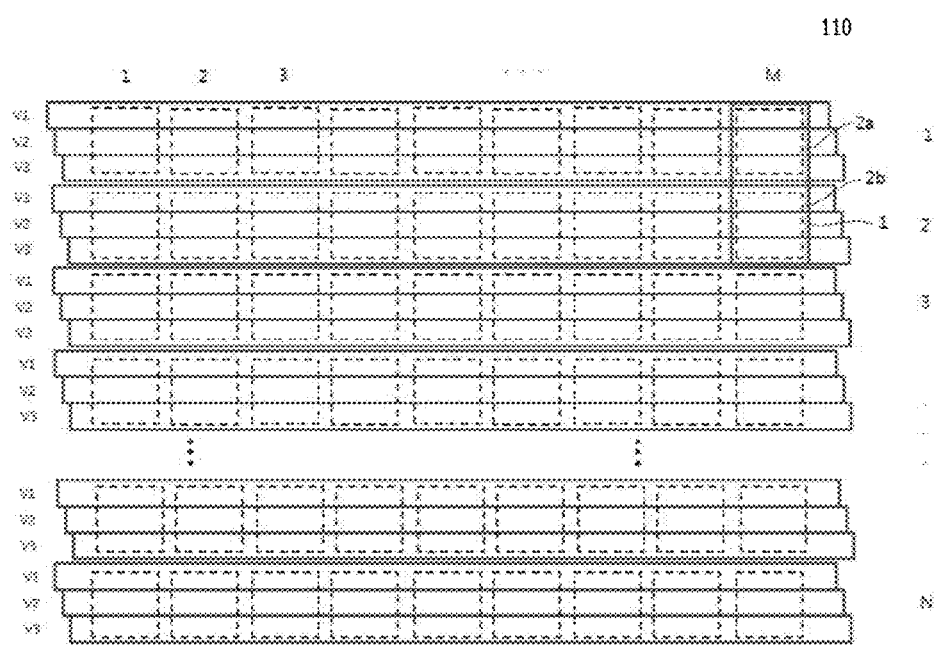
FIG. 2 is an exemplary configuration of a pixel area of FIG. 1 according to one embodiment of the present disclosure.

FIG. 2 illustrates a configuration of the pixel area 110 of FIG. 1 according to one embodiment of the present disclosure.

Referring to FIG. 2, in the TDI image sensor capable of exposure control according to one embodiment of the present disclosure, one pixel 1 may be configured with at least two storages. In another embodiment, one pixel may be configured with one storage. FIG. 2 illustrates two storages, that is, a first storage 2a and a second storage 2b, for convenience of description. One pixel may be configured to obtain the number of different images corresponding to the number of storages. One storage may be configured as one sensing device, such as a CCD. FIG. 2 illustrates that the one pixel 1 is configured with the first storage 2a and the second storage 2b.

The pixel area 110 may include N line sensors, each being configured as M image devices (e.g., M CCDs) and extending in a direction parallel to the scan direction. That is, the pixel area 110 may be configured with image devices of an M×N matrix.

In some cases, one image device forms the one pixel 1, but the pixel area 110 may be implemented so that several image devices form the one pixel 1.

Storages that form the one pixel 1 may be arranged in the scan direction, that is, in the column direction of the M×N matrix. At least two storages may be configured to form one pixel.

The pixel area 110 may be configured as a time delayed integration (TDI) image sensor. By way of example, one pixel may be configured with at least two storages formed in the column direction. That is, one pixel may be configured with several image devices disposed in the column direction.

The pixel area 110 may be configured to sense an image by accumulating and moving charges in the column direction of the respective line sensors, while integrating the charges corresponding to image signals, according to the TDI method. The pixel area 110 may be configured to move charges, accumulated in the storage unit, in the column direction under the driving control of the scan controller 400.

FIGS. 3A to 3D describes an exemplary configuration in which the pixel area 110, the light mask 120 and the microlens 130 of FIG. 1 are combined according to one embodiment of the present disclosure.

As illustrated in FIGS. 2 and 3A to 3D, the light mask 120 may be configured as a metal mask. The light mask 120 may be configured to transmit light incident on part that belongs to the pixel area 110 and that corresponds to part (e.g., half) of each of lines L1, L2, L3, and L4 and to block light from being incident on the remaining part (e.g., the remaining half) of each of the lines L1, L2, L3, and L4.

Figure 3A:
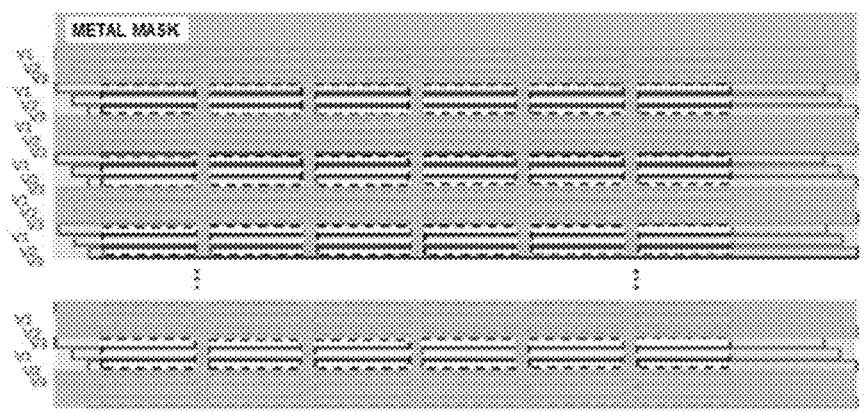
FIGS. 3A to 3D are exemplary configurations in which the pixel area, a light mask and a microlens of FIG. 1 are combined according to one embodiment of the present disclosure.
Figure 3B:
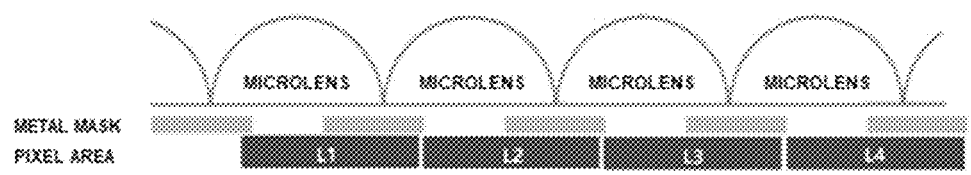
Figure 3C:
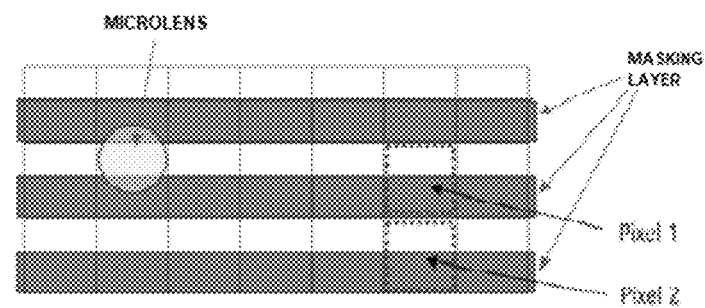
Figure 3D:
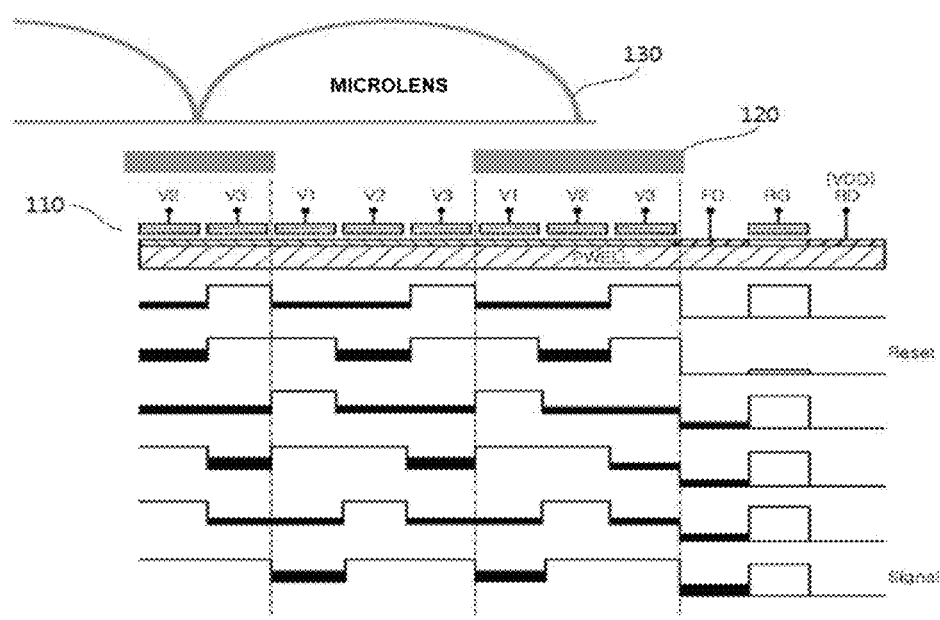

The microlens 130 may be provided on top of the exposure area of the light mask 120. The microlens 130 is an element for enhancing light incident on the exposed part of each line sensor. The microlens 130 may be provided in each exposure area and may be configured to enable more light to be incident on the pixel area 110. As illustrated in FIG. 3D, charges accumulated in a CCD are moved to the adjacent CCD (or charges accumulated in part of a CCD are moved to the remaining part of the CCD) by sequentially controlling voltages V1, V2, and V3 of the respective CCDs. The charges are overlapped and output to a charge storage node FD through the repetition of such an operation.

Figure 4:
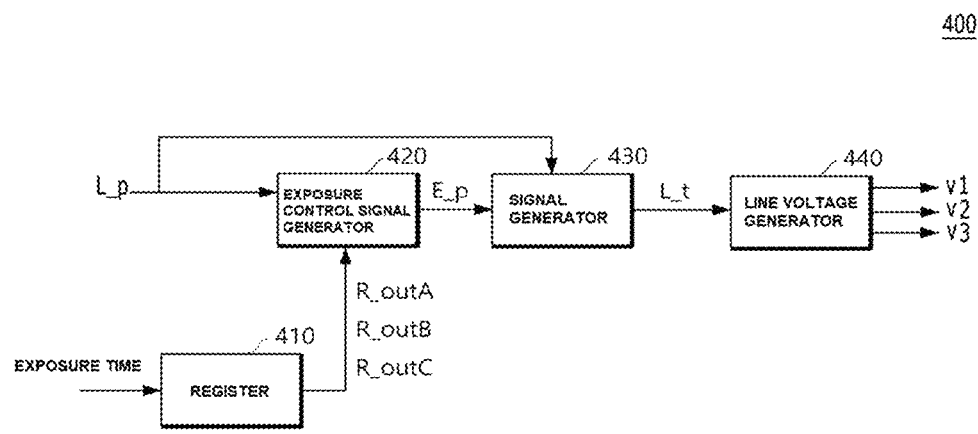
FIG. 4 is a schematic configuration of a scan controller of FIG. 1 according to one embodiment of the present disclosure.

FIG. 4 shows a schematic configuration of the scan controller 400 of FIG. 1 according to one embodiment of the present disclosure.

As illustrated in FIG. 4, the scan controller 400 may include a register 410, an exposure control signal generator 420, a signal generator 430 and a line voltage generator 440.

The register 410 may store an exposure time, set by a user, as signals R_outA, R_outB, and R_outC having digital values, and may provide the stored values to the exposure control signal generator 420. The scan controller according to one embodiment of the present disclosure can control the average brightness level of a video or image because the light exposure time of the line sensor can be determined using the register 410, based on the exposure time set by a user.

The exposure control signal generator 420 may generate the exposure control signal E_p based on the output signals R_outA, R_outB, and R_outC of the register 410 and the external line trigger signal L_p. For example, when a preset time elapses after the line trigger signal L_p is input, the exposure control signal generator 420 may generate and output the exposure control signal E_p. In this case, the preset time of the exposure control signal generator 420 may be adjusted based on the output signals R_outA, R_outB, and R_outC of the register 410. As a result, the exposure control signal generator 420 may adjust the preset time based on the output signals R_outA, R_outB, and R_outC of the register 410, and may generate and output the exposure control signal E_p when the adjusted preset time elapses after the line trigger signal L_p is input.

The signal generator 430 may generate a line timing signal L_t based on the line trigger signal L_p and the exposure control signal E_p. For example, the signal generator 430 may generate the line timing signal L_t through an OR operation each time the line trigger signal L_p and the exposure control signal E_p are received.

The line voltage generator 440 may generate a plurality of line voltages V1, V2, and V3 input to respective line sensors based on the line timing signal L_t.

Figure 5:
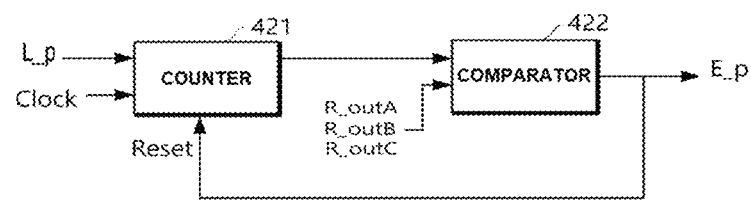
FIG. 5 shows a schematic configuration of an exposure control signal generator of FIG. 4 according to one embodiment of the present disclosure.

FIG. 5 shows a schematic configuration of the exposure control signal generator 420 of FIG. 4 according to one embodiment of the present disclosure. FIG. 5 is an exemplary configuration of the exposure control signal generator 420 according to one embodiment.

The exposure control signal generator 420 may include a counter 421 and a comparator 422.

The counter 421 may count clocks when receiving the line trigger signal L_p, and may reset counting values when receiving the exposure control signal E_p. After receiving the line trigger signal L_p, the counter 421 may provide the comparator 422 with the counting value of the clock.

The comparator 422 may generate the exposure control signal E_p by comparing the counting value, provided by the counter 421, with values of the signals R_outA, R_outB, and R_outC provided by the register 410. For example, when the counting value provided by the counter 421 is identical with values of the signals R_outA, R_outB, and R_outC provided by the register 410, the comparator 422 may output the exposure control signal E_p.

Figure 6:
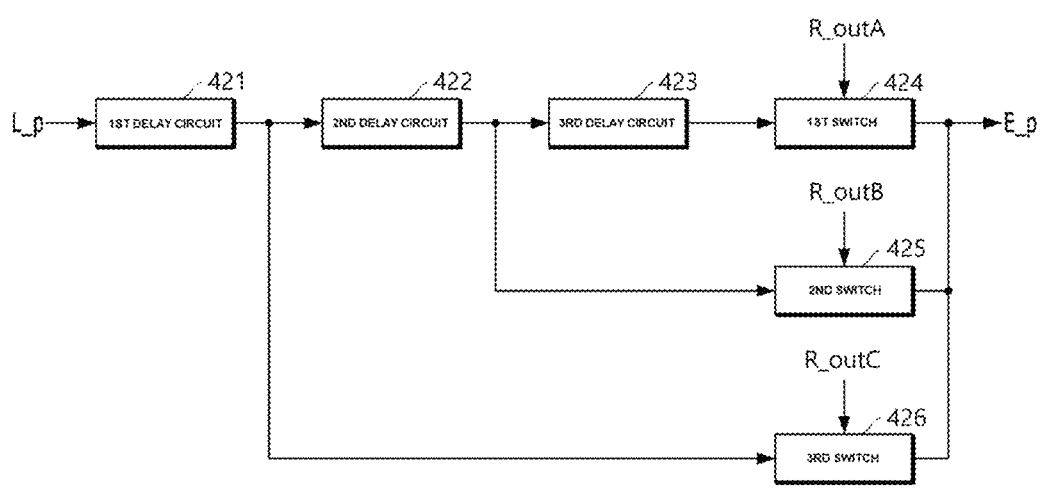
FIG. 6 shows a schematic configuration of the exposure control signal generator of FIG. 4 according to one embodiment of the present disclosure.

FIG. 6 shows a schematic configuration of the exposure control signal generator 420 of FIG. 4 according to one embodiment of the present disclosure. FIG. 6 shows an exemplary configuration of the exposure control signal generator according to another embodiment.

The exposure control signal generator 420 is configured to generate the exposure control signal E_p after the lapse of a preset time, when the line trigger signal L_p is input. FIG. 6 discloses one embodiment using an asynchronous delay circuit.

As illustrated in FIG. 6, the exposure control signal generator 420 may include first to third delay circuits 421, 422 and 423 and first to third switches 424, 425, and 426. In this case, each of the first to third delay circuits 421, 422 and 423 may be configured as an RC delay circuit.

The first delay circuit 421 may receive the line trigger signal L_p. The first delay circuit 421 may delay and output the received line trigger signal L_p.

The second delay circuit 422 may receive the output signal of the first delay circuit 421. The second delay circuit 422 may delay and output the received output signal of the first delay circuit 421.

The third delay circuit 423 may receive the output signal of the second delay circuit 422. The third delay circuit 423 may delay and output the received output signal of the second delay circuit 422.

The first switch 424 may output the output signal of the third delay circuit 423 as the exposure control signal E_p, based on the output signal R_outA of the register 410. For example, when receiving the output signal R_outA of the register 410 at a specific level, the first switch 424 may be turned on. The turned-on first switch 424 may output the output signal of the third delay circuit 423 as the exposure control signal E_p.

The second switch 425 may output the output signal of the second delay circuit 422 as the exposure control signal E_p, based on the output signal R_outB of the register 410. For example, when receiving the output signal of the register 410 at a specific level, the second switch 425 may be turned on. The turned-on second switch 425 may output the output signal of the second delay circuit 422 as the exposure control signal E_p.

The third switch 426 may output the output signal of the first delay circuit 421 as the exposure control signal E_p, based on the output signal R_outC of the register 410. For example, when receiving the output signal R_outC of the register 410 at a specific level, the third switch 426 may be turned on. The turned-on third switch 426 may output the output signal of the first delay circuit 421 as the exposure control signal E_p. In this case, a case where each of the output signals R_outA, R_outB, and R_outC of the register 410 has a specific level may correspond to an example in which the specific level is a high level of a digital logic level. Hereinafter, the output signals of the register 410 may be referred to as delayed control signals, and may be referred to as a first delayed control signal R_outA, a second delayed control signal R_outB, and a third delayed control signal R_outC.

In the exposure control signal generator 420 configured as in FIG. 6, only one of the first to third delayed control signals R_outA, R_outB, and R_outC may have a specific level, that is, a high level. The exposure control signal E_p may be output by a switch which receives a delayed control signal having a high level. This is more specifically described as follows.

When only the first delayed control signal R_outA of the first to third delayed control signals R_outA, R_outB, and R_outC has a high level, the line trigger signal L_p may be delayed by the first to third delay circuits 421, 422 and 423 and output as the exposure control signal E_p.

When only the second delayed control signal R_outB of the first to third delayed control signals R_outA, R_outB, and R_outC has a high level, the line trigger signal L_p may be delayed by the first and second delay circuits 421 and 422 and output as the exposure control signal E_p.

When only the third delayed control signal R_outC of the first to third delayed control signals R_outA, R_outB, and R_outC has a high level, the line trigger signal L_p may be delayed by the first delay circuit 421 and output as the exposure control signal E_p.

That is, when the first delayed control signal R_outA of the first to third delayed control signals R_outA, R_outB, and R_outC has a high level, the exposure control signal generator 420 illustrated in FIG. 6 may delay the line trigger signal L_p for the longest delay time, and may output the delayed line trigger signal L_p as the exposure control signal E_p. When the third delayed control signal R_outC of the first to third delayed control signals R_outA, R_outB, and R_outC has a high level, the exposure control signal generator 420 may delay the line trigger signal L_p for the shortest delay time, and may output the delayed line trigger signal L_p as the exposure control signal E_p. When the second delayed control signal R_outB of the first to third delayed control signals R_outA, R_outB, and R_outC has a high level, the exposure control signal generator 420 may delay the line trigger signal L_p for an intermediate delay time, and may output the delayed line trigger signal L_p as the exposure control signal E_p.

Figure 7:
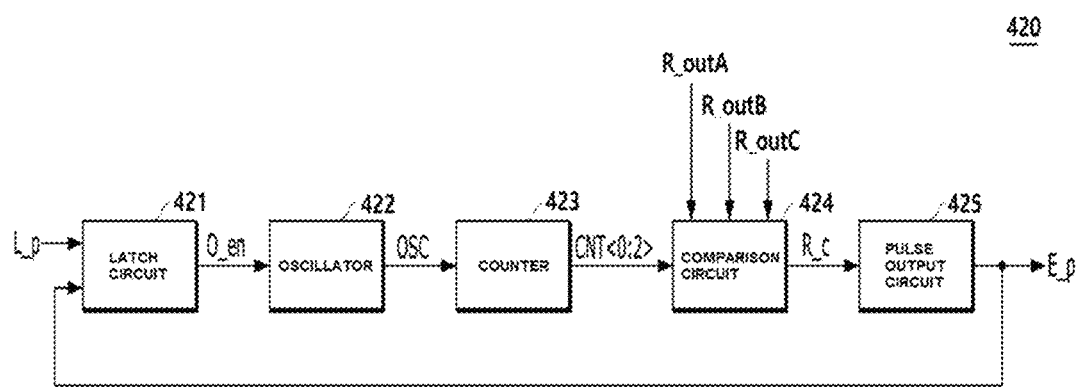
FIG. 7 shows a schematic configuration of the exposure control signal generator of FIG. 4 according to one embodiment of the present disclosure.

FIG. 7 shows a schematic configuration of the exposure control signal generator 420 of FIG. 5 according to one embodiment of the present disclosure. FIG. 7 is an exemplary configuration of the exposure control signal generator 420 of FIG. 4 according to one embodiment.

As illustrated in FIG. 7, the exposure control signal generator 420 may include a latch circuit 421, an oscillator 422, a counter 423, a comparison circuit 424 and a pulse output circuit 425.

The latch circuit 421 may receive the line trigger signal L_p and the exposure control signal E_p, and may output an oscillator enable signal O_en. For example, when receiving the line trigger signal L_p, the latch circuit 421 may enable the oscillator enable signal O_en until the exposure control signal E_p is received. That is, the latch circuit 421 may enable the oscillator enable signal O_en when receiving the line trigger signal L_p, and may disable the oscillator enable signal O_en when receiving the exposure control signal E_p. In this case, when the oscillator enable signal O_en is enabled, the oscillator enable signal O_en may have a high level of a digital logic level. When the oscillator enable signal O_en is disabled, the oscillator enable signal O_en may have a low level of a digital logic level. The latch circuit 421 may be implemented as an S-R latch circuit.

The oscillator 422 may receive the oscillator enable signal O_en and output an oscillator signal OSC. For example, the oscillator 422 may output the oscillator signal OSC that periodically shifts only in the section in which the oscillator enable signal O_en is enabled as a high level. For example, the oscillator signal OSC may be a signal whose level periodically shifts to a high level and a low level.

The counter 423 may receive the oscillator signal OSC and output a counter signal CNT<0:2>. For example, the counter 423 may increase the counting value of the counter signal CNT<0:2> whenever the level of the oscillator signal OSC shifts to a high level. More specifically, when the level of the oscillator signal OSC first shifts to a high level, the counter 423 may output the counter signal CNT<0:2> having counting values (1,0,0). When the level of the oscillator signal OSC second shifts to a high level, the counter 423 may output the counter signal CNT<0:2> having a counting value (1,1,0). When the level of the oscillator signal OSC third shifts to a high level, the counter 423 may output the counting signal CNT<0:2> having a counting value (1,1,1). In this case, a high level is indicated as 1, and a low level is indicated as 0.

The comparison circuit 424 may receive the first to third delayed control signals R_outA, R_outB, and R_outC and the counting signal CNT<0:2>, and may output a comparison result signal R_c. For example, when the first to third delayed control signals R_outA, R_outB, and R_outC and the counting signal CNT<0:2> have the same digital logic level, the comparison circuit 424 may output the comparison result signal R_c having a high level. More specifically, when levels of the first to third delayed control signals R_outA, R_outB, and R_outC are identical with levels of the counting signal CNT<0:2>, respectively, the comparison circuit 424 may output the comparison result signal R_c having a high level. When all of the first to third delayed control signals R_outA, R_outB, and R_outC have a high level and the counting signal CNT<0:2> has a counting value (1,1,1), the comparison circuit 424 may output the comparison result signal R_c having a high level.

The pulse output circuit 425 may receive the comparison result signal R_c and output the exposure control signal E_p. For example, when the comparison result signal R_c has a high level, the pulse output circuit 425 may output the exposure control signal E_p.

Figure 8:
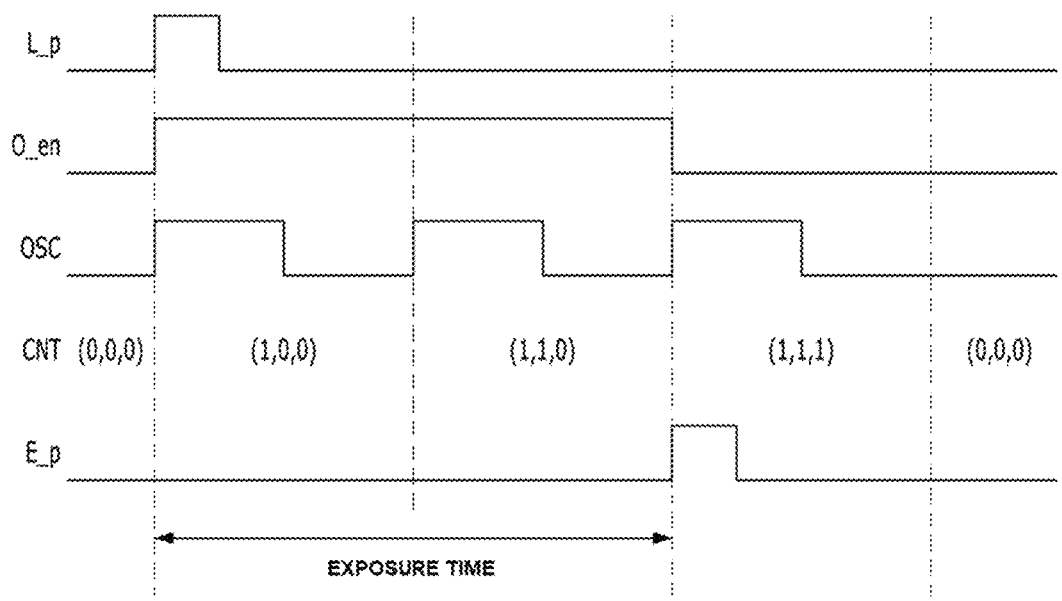
FIG. 8 is a diagram for describing an operation of the exposure control signal generator of FIG. 7.

FIG. 8 is a diagram for describing an operation of the exposure control signal generator 420 of FIG. 7.

An operation of the exposure control signal generator 420 illustrated in FIG. 7 is described as follow with reference to FIG. 8. In this case, it is assumed that all of the first to third delayed control signals R_outA, R_outB, and R_outC have a high level.

When receiving the line trigger signal L_p, the latch circuit 421 enables the level of the oscillator enable signal O_en as a high level.

When the level of the oscillator enable signal O_en is enabled as a high level, the oscillator 422 generates the oscillator signal OSC whose level periodically shifts to a high level and a low level.

When the level of the oscillator signal OSC first shifts to a high level, the counter 423 outputs the counter signal CNT<0:2> having a counting value (1,0,0).

When the level of the oscillator signal OSC second shifts to a high level, the counter 423 outputs the counter signal CNT<0:2> having a counting value (1,1,0).

When the level of the oscillator signal OSC third shifts to a high level, the counter 423 outputs the counter signal CNT<0:2> having a counting value (1,1,1).

In this case, since all of the first to third delayed control signals R_outA, R_outB, and R_outC have a high level, the comparison circuit 424 outputs the comparison result signal R_c having a high level when the counter signal CNT<0:2> has the counting value (1,1,1).

The pulse output circuit 425 receives the comparison result signal R_c having a high level, and outputs the exposure control signal E_p.

When the output exposure control signal E_p is output, the latch circuit 421 disables the level of the oscillator enable signal O_en as a low level, and the counter 423 resets the counter signal CNT<0:2>. In this case, the reset counter signal CNT<0:2> may have a counting value (0,0,0).

The exposure control signal generator 420 illustrated in FIGS. 5 to 7 discloses a configuration for generating the exposure control signal E_p by determining a delay time based on each of the levels of the first to third delayed control signals R_outA, R_outB, and R_outC, delaying the line trigger signal L_p for the determined delay time. That is, the exposure control signal generator 420 may be configured to generate the exposure control signal E_p at a constant interval with respect to the line trigger signal L_p.

Figure 9:
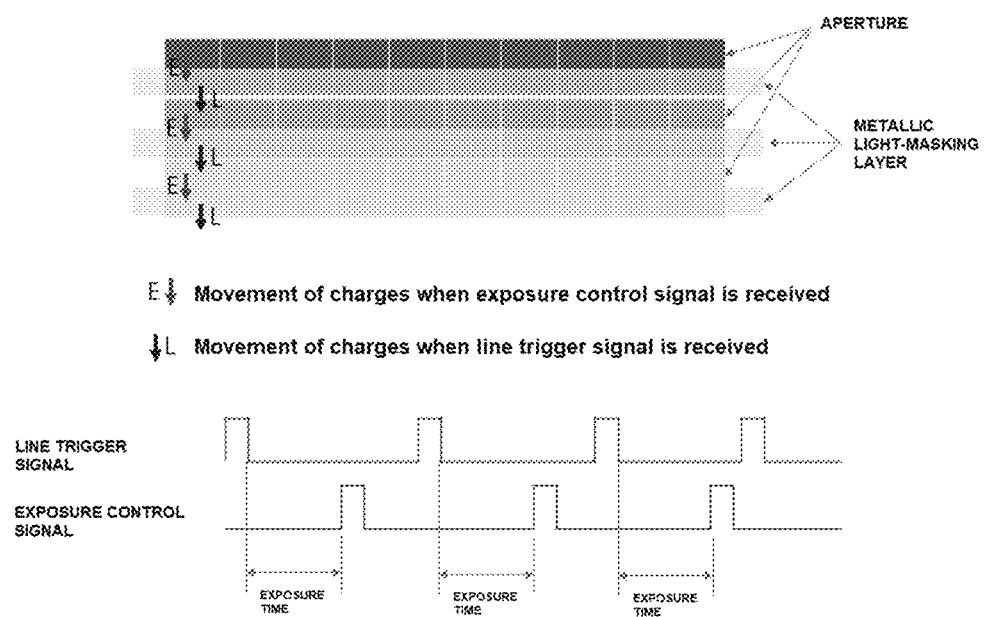
FIG. 9 is a diagram for describing an operation of a TDI image sensor capable of exposure control and an image sensor control system including the same according to one embodiment of the present disclosure.
Figure 10:
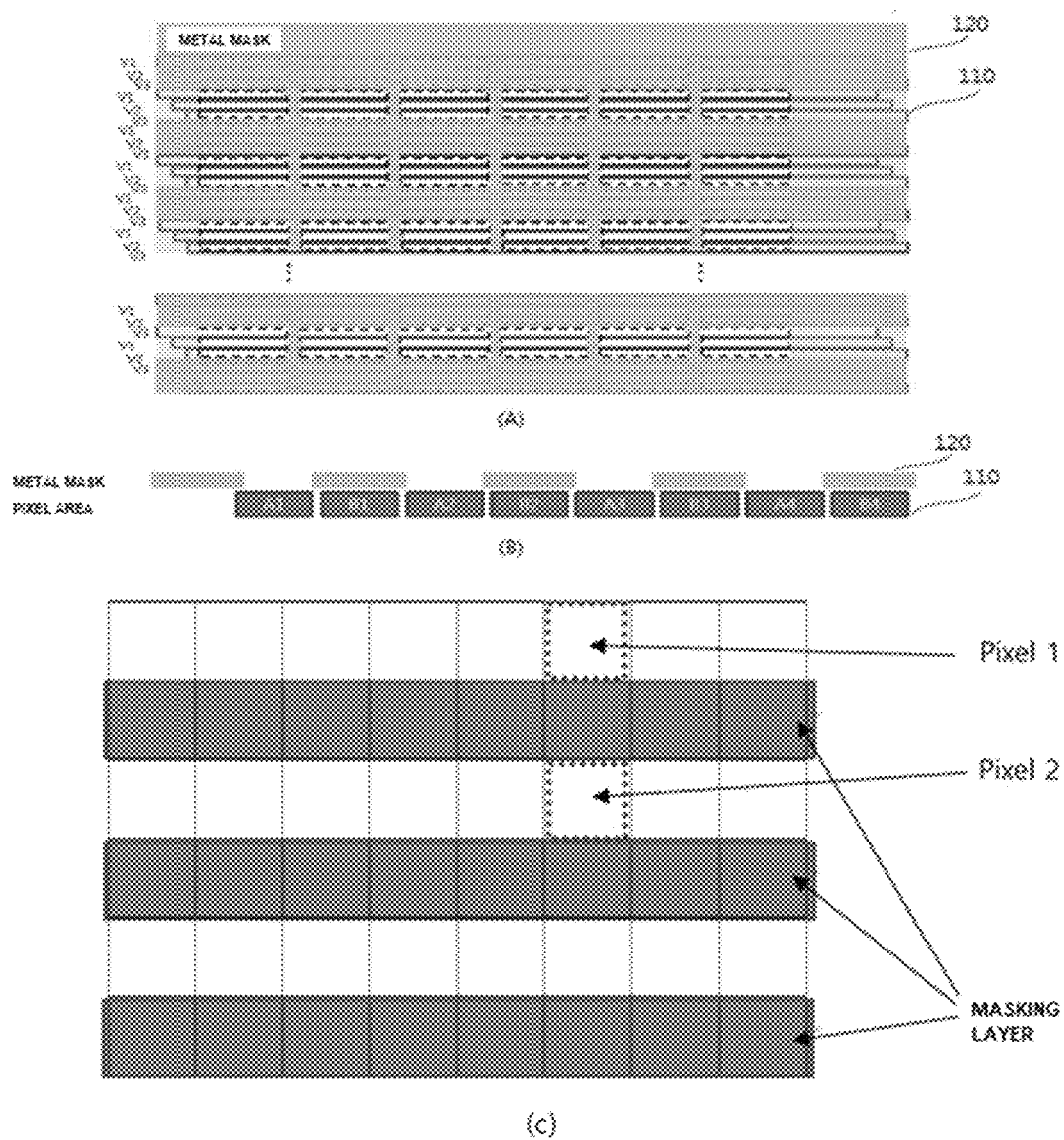
FIG. 10 shows an exemplary configuration in which the pixel area and the light mask of FIG. 1 are combined according to one embodiment of the present disclosure.

FIGS. 9 and 10 are diagrams for describing an operation of a TDI image sensor capable of exposure control according to one embodiment of the present disclosure.

FIG. 9 is a diagram for describing movement of charges in the line sensors in response to the line trigger signal and the exposure control signal.

As illustrated in FIG. 9, when the line trigger signal L_p is generated, charges may be moved from the masked part (e.g., lower half) of the line sensor, where light is blocked by the metallic light-masking layer, to the exposed part (e.g., upper half) of the line sensor on which light is incident through an aperture. When the exposure control signal E_p is generated, charges may be moved from the exposed part of the line sensor, on which light is incident through the aperture, to the part of the line sensor where light is blocked by the metallic light-masking layer.

Accordingly, the time that is taken for the exposed part of the line sensor, on which light is incident, to be exposed to light may be the same as the interval between the line trigger signal L_p and the exposure control signal E_p. Furthermore, as disclosed in FIGS. 5 to 7, the exposure control signal E_p is configured to be generated after a preset time from the generation of the line trigger signal L_p. Accordingly, in one embodiment of the present disclosure, the interval between the line trigger signal L_p and the exposure control signal E_p may be constant regardless of the period in which the line trigger signal L_p is generated or the moving speed of the scan object. That is, the exposure time of the image sensor can be maintained to be consistent regardless of the increase or decrease in the interval between the line trigger signals L_p, which is attributable to the increase or decrease in the moving speed of the scan object.

As a result, the TDI image sensor capable of exposure control according to one embodiment of the present disclosure can obtain a uniform image of the scan object because the line sensor is exposed to light for a constant time regardless of the moving speed of the scan object.

Furthermore, the average brightness level of an image of a scan object can also be controlled by decreasing or increasing time for which the exposure control signal E_p is generated after the line trigger signal L_p is input. In other words, if the time for which the exposure control signal E_p is generated from the input of the line trigger signal L_p is set to a relatively long time, the average brightness of the image of the scan object is increased because the exposure time is increased. In contrast, if the time for which the exposure control signal E_p is generated from the input of the line trigger signal L_p is set to a relatively short time, the average brightness of the image of the scan object is decreased because the exposure time is decreased.

FIG. 10 is an exemplary configuration in which the pixel area 110 and light mask 120 of FIG. 1 are combined according to another embodiment of the present disclosure.

As illustrated in FIGS. 2 and 10, the light mask 120 may be configured as a metal mask. The light mask 120 may be configured to transmit light incident on any one A1, A2, A3, or A4 of at least two line sensors that configure each pixel of the pixel area 110 and to block light incident on the remaining line sensors B1, B2, B3, and B4. That is, the light mask 120 may be configured to block light incident on odd-numbered line sensors 1, 3, 5, . . . of N line sensors constituting the pixel area 110 and to transmit light incident on even-numbered line sensors 2, 4, . . . of the N line sensors. This example is described according to one embodiment of the present disclosure, for convenience of description. However, it will be evident to those skilled in the art that the light mask 120 may be configured to block light incident on the even-numbered line sensors of the N line sensors and to expose the odd-numbered line sensors of the N line sensors to light. Unlike FIGS. 3A and 3B, FIG. 10 may disclose a configuration in which one line sensor is blocked from light and the line sensor next to the blocked line sensor is exposed to light. Accordingly, in the configuration disclosed in FIG. 10, a microlens may not be used because the part of the line sensor exposed to light in this embodiment is larger than the part of the line sensor exposed to light that is disclosed in FIGS. 3A and 3B.

Figure 11:
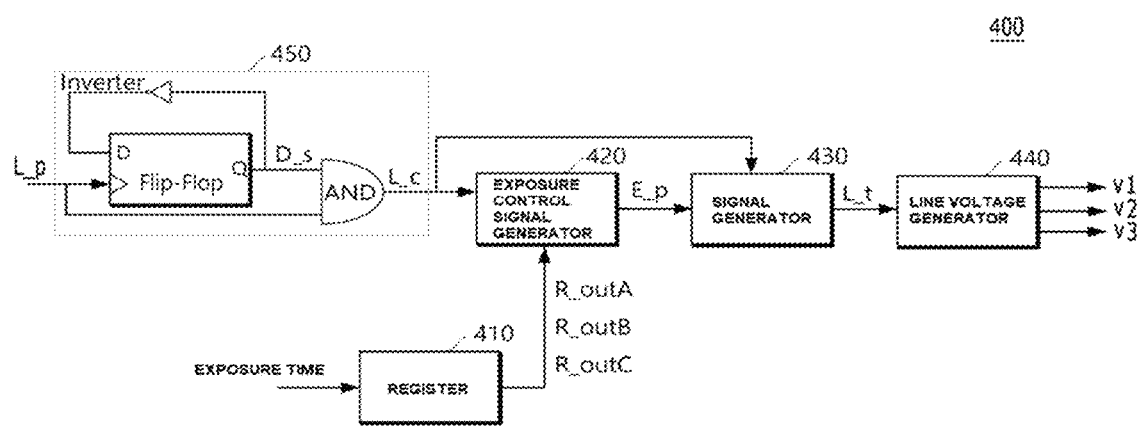
FIG. 11 shows an exemplary configuration of a scan controller according to one embodiment of the present disclosure.

FIG. 11 shows a schematic configuration of a scan controller according to another embodiment of the present disclosure. FIG. 11 illustrates a schematic configuration of a scan controller which may be applied to FIG. 10. The scan controller 400 applied to FIG. 10 may be the scan controller 400 illustrated in FIG. 4 to which the line control signal generator 450 is added.

Referring to FIG. 11, the scan controller 400 may include the register 410, the exposure control signal generator 420, the signal generator 430, the line voltage generator 440 and the line control signal generator 450.

The line control signal generator 450 may generate the line control signal L_c every time the line trigger signal L_p is received twice. For example, the line control signal generator 450 may generate the line control signal L_c when first receiving the line trigger signal L_p, and may not generate the line control signal L_c when receiving trigger signal L_p the next line.

The line control signal generator 450 may include a flip-flop, an AND gate AND, and an inverter.

The flip-flop may receive the line trigger signal L_p through a clock input stage, may receive the output signal of the inverter through a signal input stage D, may output a divided signal D_s through a signal output stage Q. At this time, the inverter may receive the divided signal D_s.

The AND gate AND may receive the divided signal D_s and the line trigger signal L_p, may perform an AND operation on the divided signal D_s and the line trigger signal L_p, and may output the results of the AND operation as the line control signal L_c.

The register 410 may store an exposure time, set by a user, as signals R_outA, R_outB, and R_outC having digital values, and may provide the stored values to the exposure control signal generator 420.

The exposure control signal generator 420 may generate an exposure control signal E_p based on the output signals R_outA, R_outB, and R_outC of the register 410 and the line control signal L_c. For example, when a preset time elapses after the line control signal L_c is input, the exposure control signal generator 420 may generate and output the exposure control signal E_p. In this case, the preset time of the exposure control signal generator 420 may be adjusted based on the output signals R_outA, R_outB, and R_outC of the register 410. As a result, the exposure control signal generator 420 may adjust the preset time based on the output signals R_outA, R_outB, and R_outC of the register 410, may generate the exposure control signal E_p when the adjusted preset time elapses after the line control signal L_c is received, and may output the generated exposure control signal E_p. The exposure control signal generator 420 disclosed in FIG. 11 may have the same internal configuration as the exposure control signal generator disclosed in FIGS. 5 to 7 except an input signal (i.e., the line control signal L_c is received instead of the line trigger signal L_p).

The signal generator 430 may generate the line timing signal L_t based on the line control signal L_c and the exposure control signal E_p. For example, the signal generator 430 may generate the line timing signal L_t whenever the line control signal L_c and the exposure control signal E_p are received.

The line voltage generator 440 may generate a plurality of line voltages V1, V2, and V3, input to respective line sensors, based on the line timing signal L_t.

Figure 12:
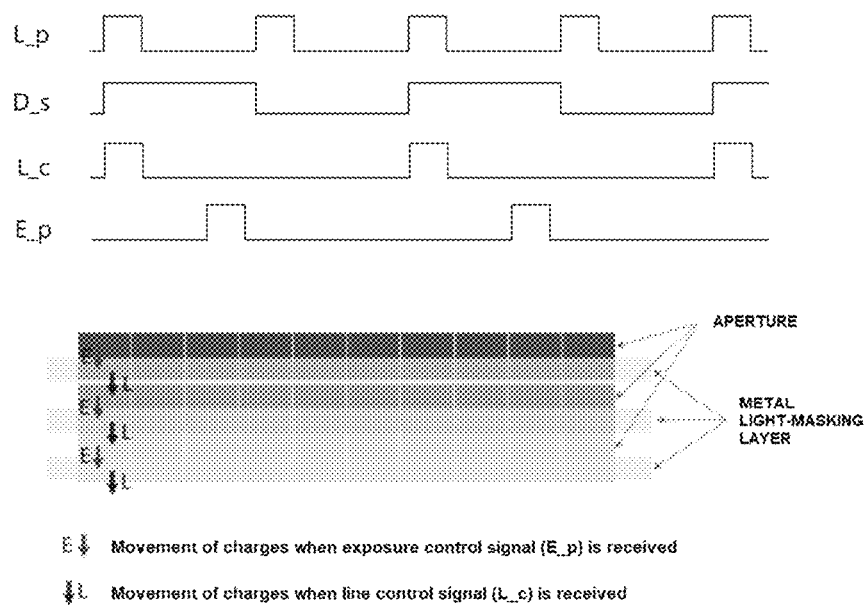
FIG. 12 is a diagram for describing an operation of the scan controller illustrated in FIG. 11.

FIG. 12 is a diagram for describing an operation of the scan controller 400 illustrated in FIG. 11.

Referring to FIG. 12, when receiving the first line trigger signal L_p, the flip-flop may shift the level of the divided signal D_s from a low level to a high level. When receiving the second line trigger signal L_p, the flip-flop may shift the level of the divided signal D_s from a high level to a low level. As described above, the flip-flop may shift a level of the divided signal D_s to another level whenever the line trigger signal L_p is received. The line control signal L_c is the results of an AND operation of the divided signal D_s and the line trigger signal L_p, and thus has a value of a high level only in the section in which both the divided signal D_s and the line trigger signal L_p have a high level. Accordingly, only whenever the line trigger signal L_p is twice input, the line control signal L_c may be generated and output as a pulse having a high level maintained for a given time. Furthermore, the exposure control signal E_p is generated based on the line control signal L_c. Accordingly, the exposure control signal E_p may be generated when a preset time based on the output signals R_outA, R_outB, and R_outC of the register 410 elapses after the line control signal L_c is generated. Accordingly, the interval between the line control signal L_c and the exposure control signal E_p may be constant.

As illustrated in FIG. 12, when the line control signal L_c is generated, charges may be moved from a line sensor (e.g., even-numbered line sensor), where light is blocked by the metallic light-masking layer, to an exposed line sensor (e.g., odd-numbered sensor) on which light is incident through an aperture. When the exposure control signal E_p is generated, charges may be moved from the exposed line sensor, on which light is incident through the aperture, to the line sensor where light is blocked by the metallic light-masking layer. Since charges have already been moved to the blocked line sensor by the exposure control signal E_p, a next line trigger signal L_p is once skipped by the line control signal generator 450 illustrated in FIG. 11.

Accordingly, the time that is taken for the line sensor, on which light is incident, to be exposed to light may be the same as the interval between the line control signal L_c and the exposure control signal E_p. The exposure control signal E_p is configured to be generated after a preset time from the generation of the line control signal L_c. Accordingly, in one embodiment of the present disclosure, the interval between the line control signal L_c and the exposure control signal E_p may be constant regardless of the period in which the line trigger signal L_p is generated or the moving speed of a scan object. That is, the exposure time of the image sensor can be maintained to be consistent regardless of the increase or decrease in the interval between the line trigger signals L_p, which is attributable to the increase or decrease in the moving speed of the scan object.

As a result, the image sensor control system including the TDI image sensor capable of exposure control according to one embodiment of the present disclosure can obtain a uniform image of the scan object because the line sensor is exposed to light for a constant time regardless of the moving speed of the scan object.

Furthermore, the average brightness level of an image of a scan object can also be controlled by decreasing or increasing the time for which the exposure control signal E_p is generated after the line trigger signal L_p is input. In other words, if the time for which the exposure control signal E_p is generated from the input of the line trigger signal L_p is set to a relatively long time, the average brightness of an image of the scan object is increased because the exposure time is increased. In contrast, if the time for which the exposure control signal E_p is generated from the input of the line trigger signal L_p is set to a relatively short time, the average brightness of an image of the scan object is decreased because the exposure time is decreased.

Figure 13:
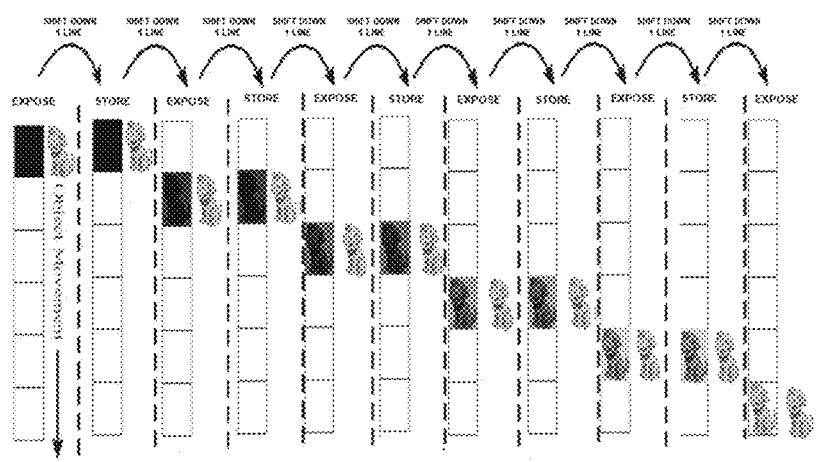
FIG. 13 is a diagram for describing an operation of an image sensor control system including a TDI image sensor according to one embodiment of the present disclosure.

Referring to FIG. 13, in the image sensor control system including the TDI image sensor capable of exposure control according to one embodiment of the present disclosure, a line sensor or a part (e.g., half, ⅓ or ¼) of the line sensor, which is exposed to light, may accumulate the amount of charges corresponding to the amount of incident light. The incidence of light on a line sensor or the remaining part of the line sensor is blocked by the metallic light-masking layer. The blocked line sensor stores charges received from the exposed line sensor and then transmits the stored charges to the next exposed line sensor when the next line trigger signal is generated. The image sensor control system including the TDI image sensor capable of exposure control according to one embodiment of the present disclosure is configured to generate the exposure control signal E_p when a preset time elapses after the line trigger signal L_p is generated.

A line sensor exposed to light accumulates, in the amount of received charges, the amount of charges corresponding to the amount of incident light. In contrast, a line sensor blocked from light stores the amount of received charges and transmits the stored charges to a next lineسensor.

As a result, in the TDI image sensor capable of exposure control and the control system including the same according to one embodiment of the present disclosure, a line sensor exposed to light and a line sensor blocked from light are configured to alternately perform exposure and storage operations. Accordingly, a uniform image having high sensitivity can be obtained because the line sensor is exposed to light for a given time regardless of the moving speed of the conveyor, e.g., a conveyor belt.

Figure 14:
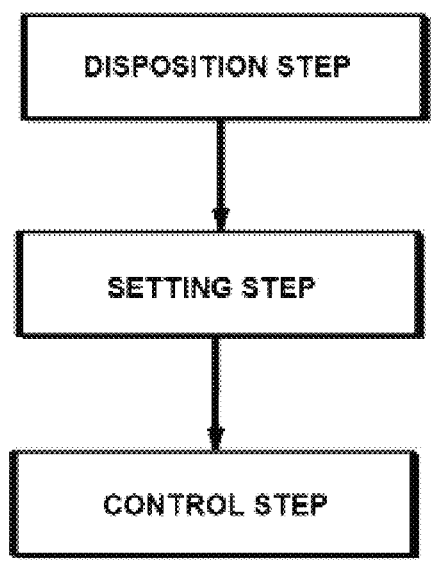
FIG. 14 is a diagram for describing a method of controlling an image sensor including a TDI image sensor according to one embodiment of the present disclosure.

A method of controlling an image sensor including the TDI image sensor capable of exposure control according to one embodiment of the present disclosure is described as follows with reference to FIG. 14.

The method of controlling an image sensor according to one embodiment of the present disclosure may include a setting step of setting an exposure time in the register of the scan controller with respect to the TDI image sensor in which the light mask has been positioned in a plurality of line sensors and a control step of controlling light to be incident on line sensors, on which the incidence of light is not blocked by the light mask, for the exposure time only.

In another embodiment, the method may further include a disposition step of sorting a plurality of line sensors into even-numbered line sensors and odd-numbered line sensors as illustrated in FIG. 10 and disposing the light mask only in the even-numbered (or odd-numbered) line sensors. Furthermore, the disposition step may include a step of disposing the light mask in front of a part of each of the line sensors as illustrated in FIGS. 3A to 3D. In this case, the disposition step may further include a step of disposing the microlens in the part that belongs to each of the line sensors and that is exposed to light. Furthermore, the setting step and the control step may be steps performed by the scan controller illustrated in FIG. 4.

The control step according to a step of blocking light incident on only part (e.g., half) of a line sensor is more specifically described. The control step may include a generation step of generating an exposure control signal when a preset time elapses after a line trigger signal is received in accordance with the moving speed of a scan object and a moving step of controlling a movement of charges in the plurality of line sensors based on the line trigger signal and the exposure control signal.

The control step according to a step of blocking light incident on the even-numbered (or odd-numbered) line sensors may include a first generation step of generating a line control signal based on a line trigger signal received in accordance with the moving speed of a scan object, a second generation step of generating an exposure control signal when a preset time elapses after the line control signal is generated, and a moving step of controlling a movement of charges in the plurality of line sensors based on the line control signal and the exposure control signal.

The TDI image sensor capable of exposure control and the control system including the same according to one embodiment of the present disclosure has an effect in that it can maximize the application field of the TDI image sensor because lines can accumulate the amount of light for a scan object during the same time and thus can obtain a uniform image having high sensitivity.

While various embodiments have been described above, it will be understood by those skilled in the art that the embodiments described are by way of example only. Accordingly, the disclosure described herein should not be limited based on the described embodiments.

What is claimed is:

1. A time delayed integration (TDI) image sensor capable of exposure control, comprising:
   a pixel area comprising a plurality of line sensors, each comprising charge coupled devices (CCDs) arranged in a row, configured to move charges, accumulated in each line sensor, in a direction parallel to a scan direction, wherein the plurality of line sensors are arranged in the direction parallel to the scan direction;
   a light mask configured to block incidence of light on part of the plurality of line sensors; and
   a scan controller configured to generate a line control signal and an exposure control signal and control movement of charges in the plurality of line sensors based on the generated line control signal and exposure control signal,
   wherein the plurality of line sensors comprise a blocked line sensor masked by the light mask and an exposed line sensor that is not masked by the light mask,
   wherein the blocked line sensor and the exposed line sensor are arranged alternately, and
   wherein the scan controller is configured to:
   control the exposed line sensor to receive charges by generating the line control signal based on a line trigger signal generated in accordance with a moving speed of a scan object and received from an outside of the scan controller, and
   control the blocked line sensor to receive charges from the exposed line sensor by generating the exposure control signal when a preset time elapses after the line control signal is generated.

2. The TDI image sensor of claim 1, wherein the line control signal and the exposure control signal are automatically generated within the scan controller based on the line trigger signal received from the outside of the scan controller.

3. The TDI image sensor of claim 1, wherein the scan controller skips transmission of charges to the exposed line sensor once by not generating the line control signal with respect to the line trigger signal once received after the exposure control signal is generated.

4. The TDI image sensor of claim 1, wherein the scan controller determines the preset time based on a delay control signal input by a user, so that the user determines an exposure time.

5. The TDI image sensor of claim 4, wherein the scan controller comprises:
   a register configured to store the preset time as a plurality of the delay control signals,
   a line control signal generator configured to generate the line control signal based on the line trigger signal,
   an exposure control signal generator configured to generate the exposure control signal when the line control signal is received and the preset time elapses,
   a signal generator configured to generate a line timing signal based on the line control signal and the exposure control signal, and
   a line voltage generator configured to generate line voltages, provided to the respective line sensors, based on the line timing signal.

6. The TDI image sensor of claim 5, wherein the line control signal generator generates the line control signal in response to the line trigger signal being received twice.

7. An inspection system using a time delayed integration (TDI) image sensor capable of exposure control, comprising:
   the TDI image sensor according to claim 1, and
   a speed detector configured to detect a moving speed of a conveyor for conveying a scan object in order to detect a moving speed of the scan object, and
   a light source configured to emit light incident on a pixel area.

8. A time delayed integration (TDI) image sensor capable of exposure control, comprising:
   a pixel area comprising a plurality of line sensors, each comprising charge coupled devices (CCDs) arranged in a row, configured to move charges, accumulated in each line sensor, in a direction parallel to a scan direction, wherein the plurality of line sensors are arranged in the direction parallel to the scan direction;
   a light mask configured to block incidence of light on part of each line sensor;
   a microlens positioned on top of an exposed part of each line sensor except a blocked part of the line sensor blocked by the light mask; and
   a scan controller configured to generate an exposure control signal based on a line trigger signal and to control movement of charges in the plurality of line sensors based on the line trigger signal and the exposure control signal,
   wherein the scan controller is configured to:
   control the exposed part to receive charges in response to a line trigger signal generated in accordance with a moving speed of a scan object and received from an outside of the scan controller, and
   control the blocked part to receive charges from the exposed part by generating the exposure control signal when the line trigger signal is generated and a preset time elapses.

9. The TDI image sensor of claim 8, wherein the light mask blocks the incidence of the light on half of each of the line sensors.

10. The TDI image sensor of claim 8, wherein the scan controller controls an exposed part of an adjacent line sensor to receive charges from the blocked part in response to a next line trigger signal received from the outside of the scan controller.

11. The TDI image sensor of claim 8, wherein the scan controller determines the preset time based on a delay control signal input by a user, so that the user determines an exposure time.

12. The TDI image sensor of claim 11, wherein the scan controller comprises:
   a register configured to store the preset time as a plurality of the delayed control signals,
   an exposure control signal generator configured to generate the exposure control signal when the line trigger signal is input and the preset time elapses,
   a signal generator configured to generate a line timing signal based on the line trigger signal and the exposure control signal, and
   a line voltage generator configured to generate line voltages, provided to the respective line sensors, based on the line timing signal.

13. The TDI image sensor of claim 12, wherein the exposure control signal generator generates the exposure control signal by delaying the line trigger signal for the preset time determined by the delayed control signal.

14. The TDI image sensor of claim 13, wherein the exposure control signal generator comprises:
a plurality of delay circuits coupled in series, and
a plurality of switches configured to receive output signals of the plurality of delay circuits, respectively, and to selectively output the received output signals of the delay circuits based on the plurality of delayed control signals, respectively.

15. The TDI image sensor of claim 12, wherein the exposure control signal generator comprises:
a latch circuit configured to enable an oscillator enable signal until the exposure control signal is input after the line trigger signal is received,
an oscillator configured to generate an oscillator signal during an enable section of the oscillator enable signal,
a counter configured to increase a counting value of a counter signal whenever the oscillator signal shifts to a specific level,
a comparison circuit configured to generate a comparison result signal by comparing the delayed control signal and the counting value of the counting signal, and
a pulse output circuit configured to generate the exposure control signal based on the comparison result signal.

16. A method of controlling a time delayed integration (TDI) image sensor comprising a plurality of line sensors, each comprising charge coupled devices (CCDs) arranged in a row, configured to move charges, accumulated in each line sensor, in a direction parallel to a scan direction, wherein the plurality of line sensors are arranged in the direction parallel to the scan direction, the method comprising:
a disposition step of sorting the plurality of line sensors into an even-numbered line sensor and an odd-numbered line sensor and disposing a light mask only in the even-numbered line sensor;
a setting step of setting an exposure time in a register of a scan controller with respect to the TDI image sensor in which the light mask is positioned in the plurality of line sensors; and
a control step of controlling light to be incident on line sensors, on which incidence of light is not blocked by the light mask, for only the exposure time,
wherein the control step comprises:
controlling the odd-numbered line sensor to receive charges by generating a line control signal based on a line trigger signal received in accordance with a moving speed of a scan object, and
controlling the even-numbered line sensor to receive charges from the odd-numbered line sensor by generating an exposure control signal when a preset time elapses after the line control signal is generated.

17. The method of claim 16, wherein the disposition step comprises disposing a microlens on part of each line sensor exposed to light.

18. The method of claim 16, wherein the setting step and the control step are performed by the scan controller.

19. The method of claim 16, wherein the control step comprises skipping transmission of charges to an adjacent odd-numbered line sensor once by not generating the line control signal with respect to the line trigger signal once received after the exposure control signal is generated.

* * * * *